US012749517B2

(12) United States Patent
Magill et al.

(10) Patent No.: US 12,749,517 B2
(45) Date of Patent: Sep. 29, 2026

(54) FLEXIBLE SRAM PRE-CHARGE SYSTEMS AND METHODS FOR MINIMIZING LEAKAGE AND REDUCING POWER CONSUMPTION

(71) Applicant: Microsoft Technology Licensing, LLC, Redmond, WA (US)

(72) Inventors: Kevin Neal Magill, Durham, NC (US); Chiaming Chai, Cary, NC (US); Jay Paresh Jadav, Morrisville, NC (US)

(73) Assignee: Microsft Technology Licensing, LLC, Redmond, WA (US)

( * ) Notice: Subject to any disclaimer, the term of this patent is extended or adjusted under 35 U.S.C. 154(b) by 83 days.

(21) Appl. No.: 18/154,436

(22) Filed: Jan. 13, 2023

(65) Prior Publication Data

US 2024/0242748 A1 Jul. 18, 2024

(51) Int. Cl.

| | |
|---|---|
| *G11C 7/24* | (2006.01) |
| *G11C 5/14* | (2006.01) |
| *G11C 7/12* | (2006.01) |
| *G11C 11/412* | (2006.01) |
| *G11C 11/413* | (2006.01) |
| *G11C 11/417* | (2006.01) |
| *G11C 11/418* | (2006.01) |

(Continued)

(52) U.S. Cl.

CPC ................ *G11C 7/24* (2013.01); *G11C 5/148* (2013.01); *G11C 7/12* (2013.01); *G11C 11/412* (2013.01); *G11C 11/413* (2013.01); *G11C 11/417* (2013.01); *G11C 11/418* (2013.01); *G11C 11/419* (2013.01); *G11C 7/1039* (2013.01)

(58) Field of Classification Search

CPC .. G11C 7/24; G11C 5/148; G11C 7/12; G11C 11/412; G11C 11/413; G11C 11/417; G11C 11/418; G11C 11/419; G11C 7/1039; G11C 7/1042

See application file for complete search history.

(56) References Cited

U.S. PATENT DOCUMENTS 10,217,494 B2 * 2/2019 Giridhar .................. G11C 8/12
2001/0014046 A1 * 8/2001 Sakamoto ................ G11C 8/00 365/205

(Continued)

OTHER PUBLICATIONS

International Search Report and Written Opinion received for PCT Application No. PCT/US23/083017, Jun. 11, 2024, 11 pages.

(Continued)

*Primary Examiner* — Mushfique Siddique
(74) *Attorney, Agent, or Firm* — Seed Intellectual Property Law Group LLP

(57) ABSTRACT

Embodiments of the present disclosure include techniques for pre-charging an SRAM. A pre-charge signal may be used to apply a pre-charge voltage to bit lines in an SRAM memory bank. Features and advantages of the present disclosure include receiving a pre-charge signal in an SRAM and storing the pre-charge signal. The pre-charge signal may be received and stored on a cycle where the SRAM is performing a memory access. The stored pre-charge signal may be applied on a later cycle. In some embodiments, an SRAM is partitioned into multiple sub-banks, and multiple pre-charge signals are received and stored for different sub-banks. Stored pre-charge signals may be applied to the different sub-banks independently, for example.

19 Claims, 6 Drawing Sheets

(51) Int. Cl.
*G11C 11/419* (2006.01)
*G11C 7/10* (2006.01)

(56) References Cited

U.S. PATENT DOCUMENTS

| | | | | | |
|---|---|---|---|---|---|
| 2004/0120210 | A1* | 6/2004 | Lee | G11C 7/22 | 365/232 |
| 2004/0204162 | A1* | 10/2004 | Mendoza | H03G 3/348 | 455/569.1 |
| 2006/0164904 | A1* | 7/2006 | Saleh | G11C 16/24 | 365/226 |
| 2008/0123452 | A1* | 5/2008 | Kim | G11C 11/4094 | 365/233.1 |
| 2011/0149661 | A1* | 6/2011 | Rajwani | G11C 11/418 | 365/189.11 |
| 2013/0044551 | A1* | 2/2013 | Kuroda | G11C 11/1653 | 365/189.11 |
| 2014/0307500 | A1* | 10/2014 | Su | G11C 11/419 | 365/189.11 |
| 2014/0328113 | A1* | 11/2014 | Chai | G11C 7/1075 | 365/154 |
| 2015/0109865 | A1* | 4/2015 | Gulati | G11C 11/419 | 365/189.02 |
| 2016/0163379 | A1* | 6/2016 | Roine | G11C 7/1039 | 365/154 |
| 2017/0352407 | A1* | 12/2017 | Arsovski | G11C 11/419 | |

OTHER PUBLICATIONS

International Preliminary Report on Patentability received for PCT Application No. PCT/US23/083017, mailed on Jul. 24, 2025, 06 pages.

* cited by examiner

FLEXIBLE SRAM PRE-CHARGE SYSTEMS AND METHODS FOR MINIMIZING LEAKAGE AND REDUCING POWER CONSUMPTION

BACKGROUND

The present disclosure relates generally to computing, and in particular, to flexible static random access memory (SRAM) pre-charge systems and methods.

SRAM memories typically pre-charge their bit lines to a high-voltage state before a read or write access can take place. When an SRAM's bit lines are in a pre-charged state, the SRAM will typically exhibit more leakage power than in the non-pre-charged state. In addition, multiple large drivers within an SRAM, such as word line drivers, contribute a large amount of the overall SRAM leakage power. To improve power consumption in designs using SRAMs, it is desirable to minimize the time SRAMs are in the high leakage state.

DETAILED DESCRIPTION

Described herein are techniques for pre-charging an SRAM. In the following description, for purposes of explanation, numerous examples and specific details are set forth in order to provide a thorough understanding of some embodiments. Various embodiments as defined by the claims may include some or all of the features in these examples alone or in combination with other features described below and may further include modifications and equivalents of the features and concepts described herein.

Features and advantages of the present disclosure include a mechanism to use an dynamic explicit pre-charge scheme on an SRAM while allowing the system to initiate a pre-charge request to the SRAM while a previous access is in progress on a current within the SRAM. This leads to a reduction in leakage power without adding additional latency to the SRAM access. The techniques described herein may be used with or without grouping SRAMs into "banks" to achieve parallelism as described below.

In some embodiments, an SRAM includes circuitry to (1) pipeline the pre-charge/SRAM access cycles and (2) determine whether to put the SRAM in the low leakage state after a current access or to keep the SRAM in pre-charge state ready for the next access. A pre-charge request can be provided to the SRAM one or more cycles before an SRAM access. However, during an SRAM access, a new pre-charge request for the next access can be provided to the SRAM (e.g., a pipelined pre-charge feature). In some embodiments, the SRAM may further determine whether to keep a header/footer voltage on and pre-charge the bit lines after the current access, or to turn off the header/footer voltage and not to pre-charge the bit lines after the current access in order to put the SRAM in a low leakage state. These techniques provide a flexible solution since the SRAM can dynamically either always keep the pre-charge input asserted or explicitly pre-charge on demand, but without the additional performance penalty to pre-charge.

Additionally, in some embodiments, the SRAM allows for dynamic pre-charging of select memory sub-banks of an SRAM for more granular pre-charging. Further, a pre-charge-reset input (e.g., pre-charge-reset-all) may be provided in the SRAM, which clears the pre-charged SRAM bit lines for all sub-banks, and in some embodiments, the pipelined pre-charge requests inside the SRAM, for example.

Figure 1:
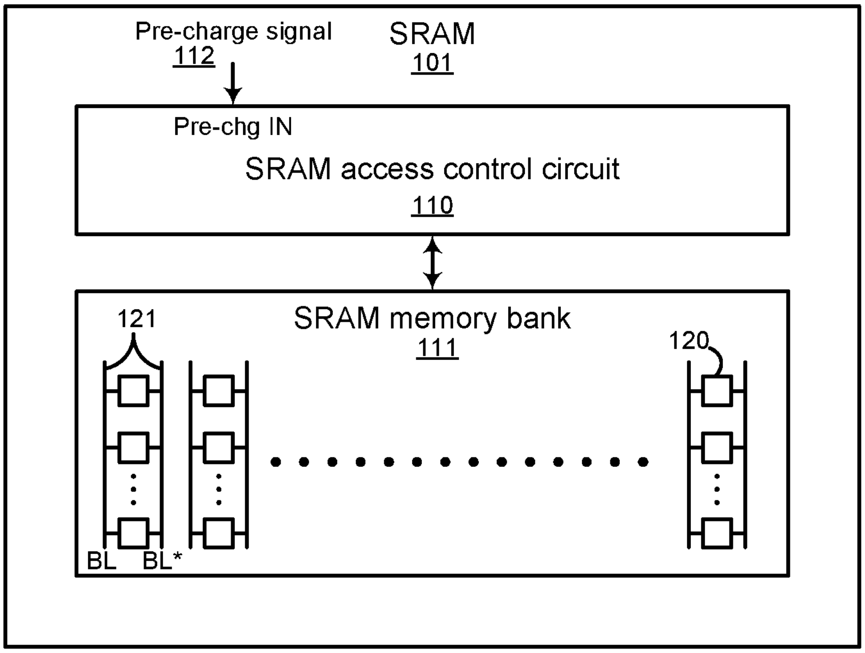
FIG. 1 illustrates an SRAM according to an embodiment.

FIG. 1 illustrates an SRAM 101 according to an embodiment. SRAM 101 includes an SRAM memory bank 111 and an SRAM access control circuit 110. SRAM memory bank 111 is configured to store bits of data 120 (e.g., using latch configured CMOS transistors) and comprises a plurality of bit lines 121 (e.g., typically 2 bit lines—BL and BL*). SRAM access control circuit 110 is configured with digital logic circuits for performing operations on SRAM memory bank 111, such as reading and writing data to and from an array of bit cells in the memory bank 111. Advantageously, SRAM access control circuit 110 is coupled to the plurality of bit lines 121 of the SRAM memory bank 111 to pre-charge the plurality of bit lines 121 to access the stored bits of data 120. SRAM access control circuit 110 receives and stores a pre-charge signal 112. The pre-charge control signal 112 may be stored to pre-charge bit lines for a subsequent cycle when the SRAM access control circuit 110 is accessing stored bits of data 120 in the SRAM memory bank 111 on a current cycle.

Accordingly, an SRAM circuit may include pre-charge request inputs (Pre-chg IN") that receive the pre-charge signal. The pre-charge signal may be a digital signal, and in various embodiments may comprise one bit or a plurality of bits, for example. Using the pre-charge signal, the SRAM may assert a pre-charge request when an SRAM access (e.g., read or write) is already in progress, for example.

For instance, SRAM access control circuit 110 may receive and store a pre-charge signal 112 to implement any of the following scenarios. When the SRAM access control circuit is not accessing stored bits of data in the SRAM memory bank on the current cycle, the pre-charge signal may cause the plurality of bit lines to pre-charge. Similarly, when the SRAM access control circuit is accessing stored bits of data in the SRAM memory bank on the current cycle, the pre-charge signal may be stored in the SRAM access control circuit to automatically pre-charge the plurality of bit lines when the current memory access is completed. Alternatively, when the pre-charge signal indicates there is no pre-charge for the subsequent cycle, then the SRAM access control circuit does not pre-charge the bit lines when the current memory access is completed. Further, when the pre-charge signal indicates there is no pre-charge for the subsequent cycle, then the SRAM access control circuit may further turn off one or more head switches providing power to a plurality of word lines when the current memory access is completed. An example of a head switch is illustrated further below.

Figure 2:
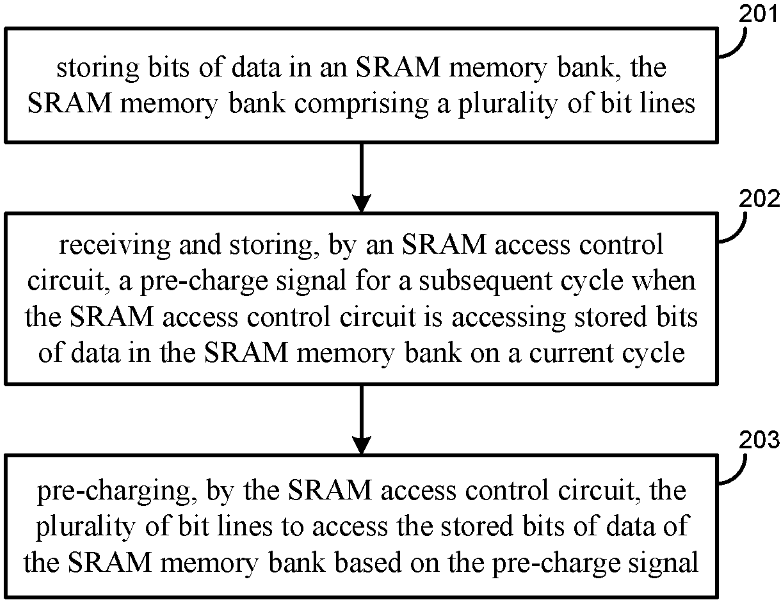
FIG. 2 illustrates a method of pre-charging an SRAM according to an embodiment.

FIG. 2 illustrates a method of pre-charging an SRAM according to an embodiment. At 201, bits of data are stored in an SRAM memory bank comprising a plurality of bit lines. At 202, a pre-charge signal for a subsequent cycle is received and stored by an SRAM access control circuit when the SRAM access control circuit is accessing stored bits of data in the SRAM memory bank on a current cycle. At 203, the bit lines are pre-charged by the SRAM access control circuit based on the pre-charge signal to access the stored bits of data of the SRAM memory bank.

Figure 3:
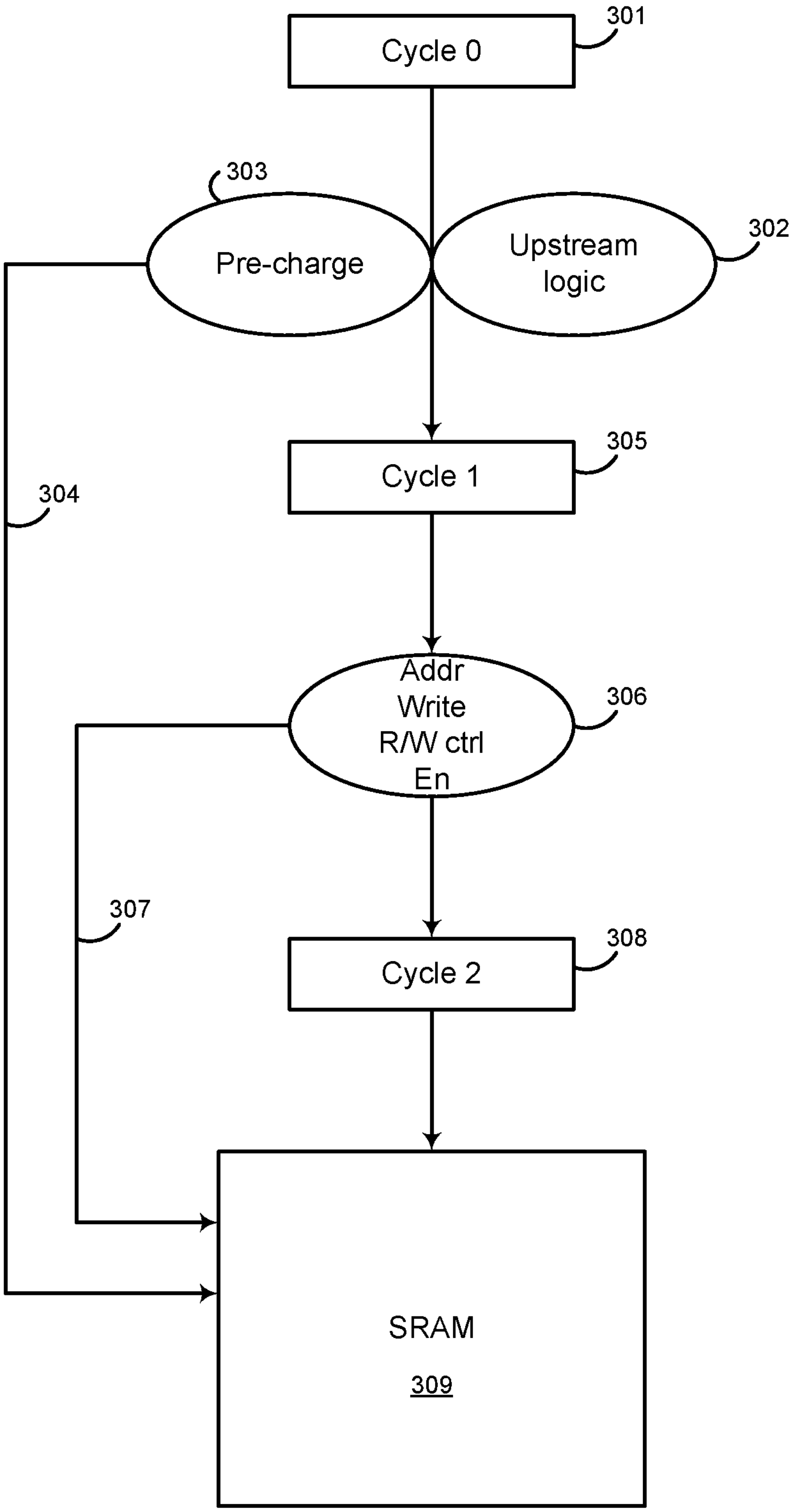
FIG. 3 illustrates SRAM pre-charging according to another embodiment.

FIG. 3 illustrates SRAM pre-charging according to another embodiment. During cycle 0 301 upstream logic 302 in a system may cause the generation of a pre-charge signal at 303. The upstream logic may correspond to an impending memory read or write, for example. The pre-charge signal 304 is coupled to SRAM 309 indicating a pre-charge is to occur on a subsequent cycle. SRAM 309 may be in the process of performing another read or write at the same time the pre-charge signal is received. SRAM 309 may store the pre-charge signal for use on a later cycle, for example. During cycle 1 305 information for performing an operation may be provided to the SRAM, such as address, a write command (for writes), read/write control signals, and a memory enable signal, for example. During cycle 2, the memory access operation is carried out on a current cycle (cycle 2) using the pre-charge signal received on a previous cycle.

Figure 4:
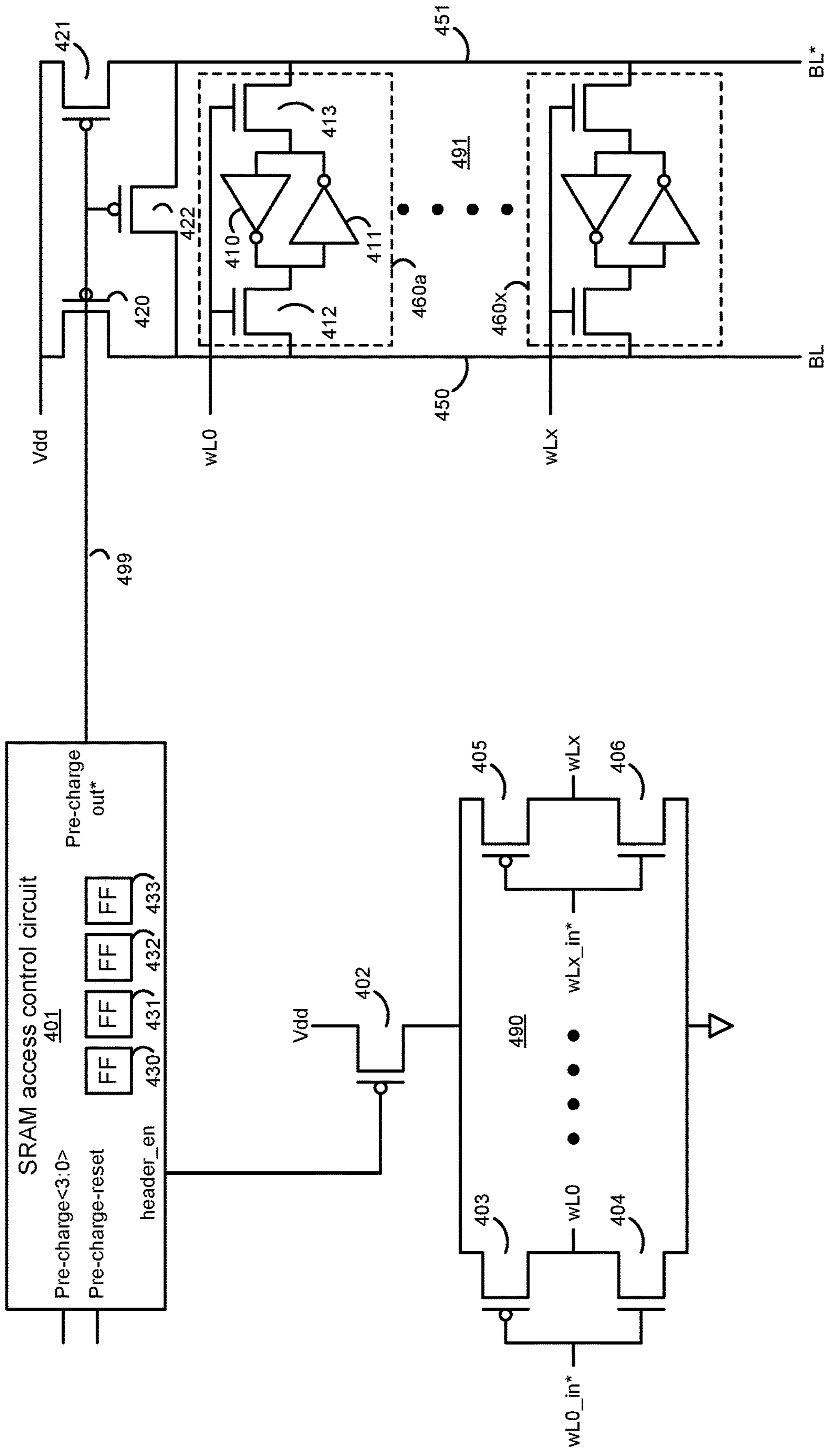
FIG. 4 illustrates SRAM circuitry according to an embodiment.

FIG. 4 illustrates SRAM circuitry according to an embodiment. This example diagram illustrates SRAM access control circuit 401, a word line driver section 490 and a column 491 of a memory bank including a pair of bit lines (BL/BL*) 450-451 and corresponding bit cells 460*a-x*. In this example, a pre-charge signal comprises a 4-bit digital signal ("pre-charge<3:0>") for pre-charging 4 corresponding sub-banks of a 4-partition memory, which is illustrated below. It is to be understood that other memory partitions may be used in other embodiments. Pre-charge bits may be stored in flip flops (e.g., set-reset flip flops) 430-433, for example, and coupled to pre-charge outputs ("pre-charge out*," active low) that are coupled to particular bit lines.

This example illustrates 2 bit lines 450-451 coupled to a plurality of bit cells 460*a-x*. A bit cell 460*a* comprises cross coupled inverters 410-411 coupled to bit lines 450-451 through NMOS transistors 412-413, which are controlled by word line inputs, wL0-x, for example. Inverters each may include 2 transistors. Accordingly, the bit cell in FIG. 4 is an example of a 6 transistor (6T) bit cell. In this example, a pre-charge output of SRAM access control circuit 401 is coupled to gates of PMOS transistors 420-421, which are coupled between the bit lines 450-451 and a power supply voltage, Vdd. When pre-charge out* 499 is high (inactive), PMOS transistors 420-422 are off and the bit lines are floating. However, during a pre-charge, pre-charge out* is low (active) and PMOS transistors 420-422 are turned on, connecting the bit lines 450-451 together and to Vdd, thus pre-charging the bit lines before the word line inputs are applied (at which point the pre-charge is turned off).

FIG. 4 further shows another aspect of the present disclosure. An SRAM may comprise a word line driver section 490 comprising inverter configured transistors for each word line (e.g., 403/404 and 405/406), which are coupled to Vdd through a head switch transistor 402. Advantageously, when an access is not going to occur, the head switch may be turned off to further reduce leakage and power consumption. Accordingly, the same pre-charge signal used to control pre-charge may be used to control the head switch to further improve performance of the memory circuit.

In the example in FIG. 4, the SRAM access control circuit 401 further comprises a pre-charge-reset input. Pre-charge reset may be used to clear the pre-charge on plurality of bit lines. In some embodiments, the pre-charge-reset input may further clear pre-charge signals stored in the SRAM access control circuit (e.g., in the FFs). In some embodiments, the pre-charge-reset input further turns off one or more head switches providing power to a plurality of word lines (e.g., deactivating "header_en").

Figure 5:
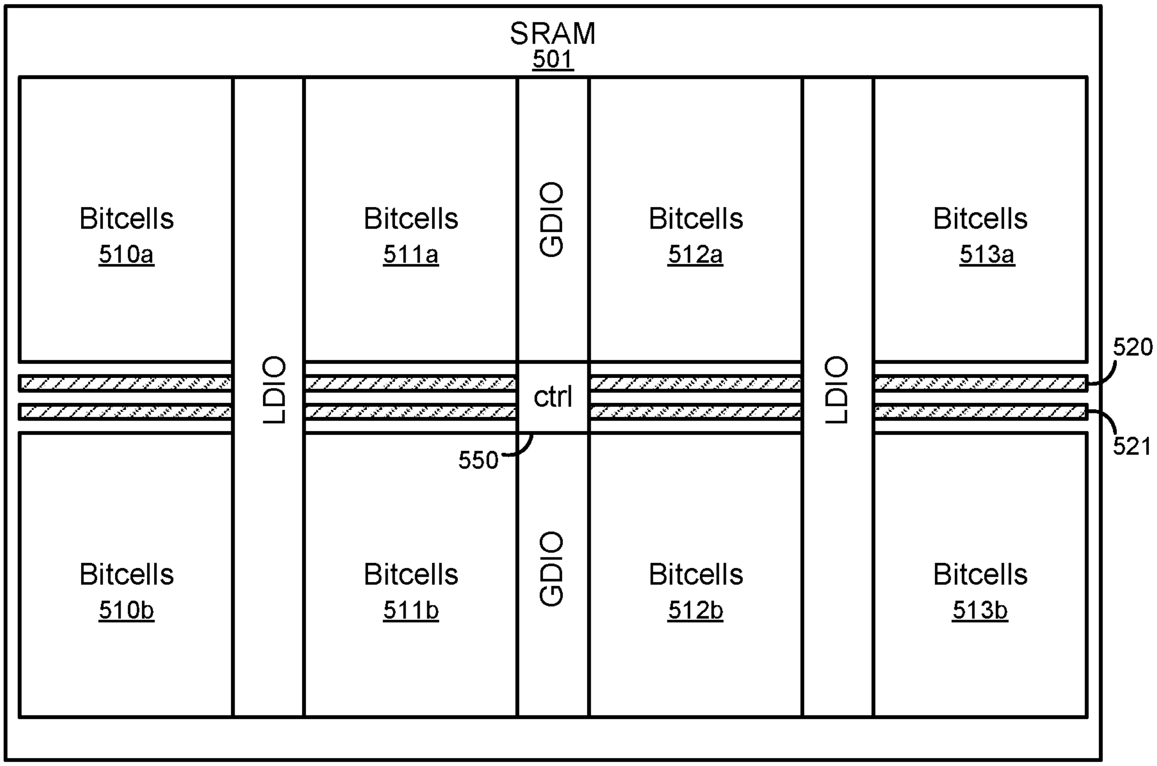
FIG. 5 illustrates an SRAM layout according to an embodiment.

FIG. 5 illustrates an SRAM layout according to an embodiment. In various embodiments, SRAM memory banks may be partitioned into multiple sub-banks. FIG. 5 illustrates a partition comprising four (4) sub-banks 510, 511, 512, and 513. A local data input/output bus (LDIO) runs between sub-banks 510 and 511 and a LDIO bus runs between sub-banks 512 and 513. Accordingly, the banks are shown as 510*a-b*, 511 *a-b*, 512 *a-b*, and 513*a-b* (on either side of each LDIO). SRAM access control circuitry may be configured at 550, for example. Word line drivers and head switches may be configured in the layout as shown at 520 and 521, for example. In this example the control circuitry may comprise a 4 bit digital pre-charge signal and 4 pre-charge output signals to activate bit lines in different sub-banks 510-513, for example. In some embodiments, multiple pre-charge voltages may be applied independently within sub-banks.

Figure 6:
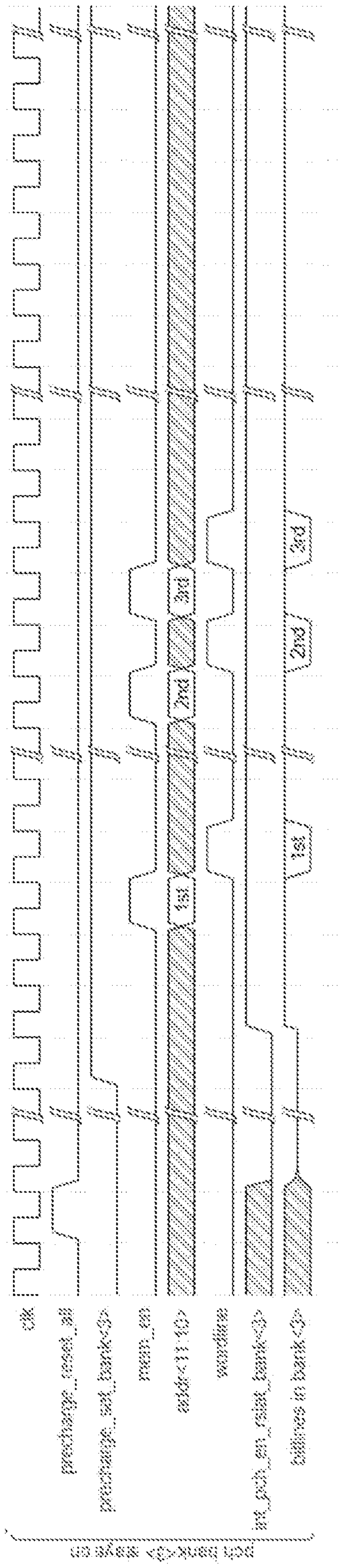
FIG. 6 illustrates an SRAM timing diagram.

FIG. 6 illustrates an SRAM timing diagram. The following example uses a 6 transistor (6T) bit cell illustrated above. 6T SRAM memories may use column-muxing, such as 4-to-1 or 8-to-1. Typically, only one set of bit lines (such as 1 of 4, or 1 of 8) are being used during a memory operation for a given I/O column of the memory. The other unused sets of bit lines with corresponding word lines asserted would have either true or complement side (BL, BL*) of the bit lines discharged by the bit cells, but the values for those bit lines may not be used (e.g., known as a "dummy read"). Before an SRAM memory access, bit lines are pre-charged before a word line is asserted. During an SRAM idle/ready state, all word lines are de-asserted and the bit lines may be pre-charged so they are ready for the next memory operation. However, bit lines may also be floating in the idle state to save leakage, as long as the bit lines are pre-charged before the next memory access. During a memory access, the word line is asserted, and the bit lines are driven to logic 0 or logic 1 states. For read or dummy read, either the true or complement bit lines are being driven to logic "0" by the memory bit cells. The other bit lines start with pre-charged logic "1" state, and are then held at logic "1" state initially by the bit line capacitance, and later held by bit cells at "weak 1" state, since bit cells drive only "weak 1" through NMOS access transistors. For write operation, the bit lines are driven to logic 0 or logic 1 state by the write drivers coupled to the bit lines (not shown).

Referring to FIG. 6, precharge_set_bank<x> input stays asserted. At idle, bit lines are pre-charged (precharge_set_bank<x> asserted causes int_pch_en_rslat_bank<x> to be asserted). When the SRAM is being accessed (e.g., a word line turns on), bit line pre-charge is turned off and bit lines are being driven to logic 0/1. After access, bit lines are pre-charged, since int_pch_en_rslat_bank<x> is asserted.

Figure 7:
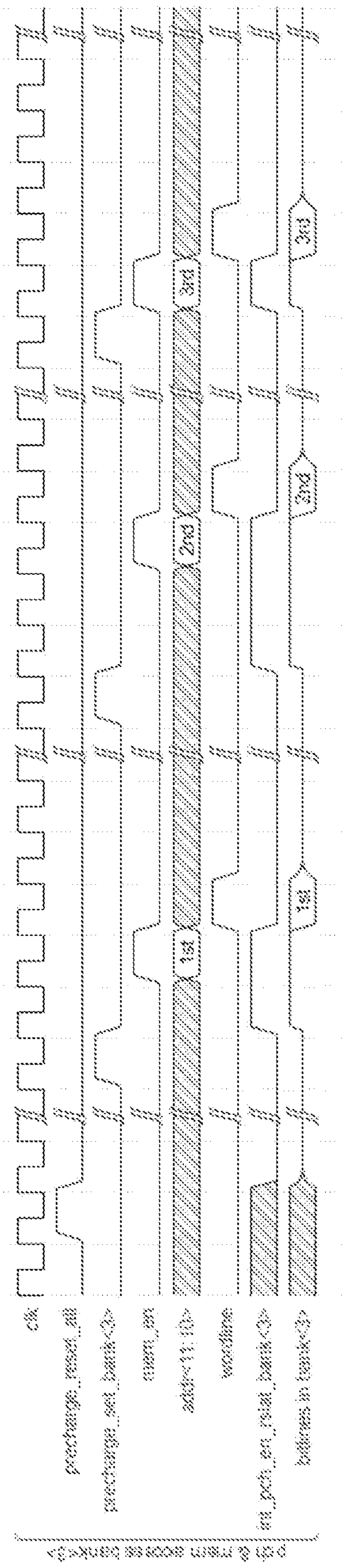
FIG. 7 illustrates another SRAM timing diagram.

FIG. 7 illustrates another SRAM timing diagram. In this example, pre-charge occurs at least one cycle before memory access. For example, pre-charge may occur at 2, 3, or 1 cycles before the memory access cycles, or more generally, the precharge may occur N cycles before the mem_en cycle, where N is any integer greater than or equal to 1. Once a precharge_set_bank is asserted with the rising edge of the clock (clk), the corresponding bit lines are pre-charged. At the clk rising edge, with mem_en asserted int_pch_en_rslat_bank<x> get reseted to logic 0 because precharge_set_bank<x> are not asserted at those cycles.

When the SRAM is being accessed (e.g., when the word line turns on), the bit lines are being driven to logic 0/1. After access, int_pch_en_rslat_bank<x> is de-asserted and the bit lines are floating.

Figure 8:
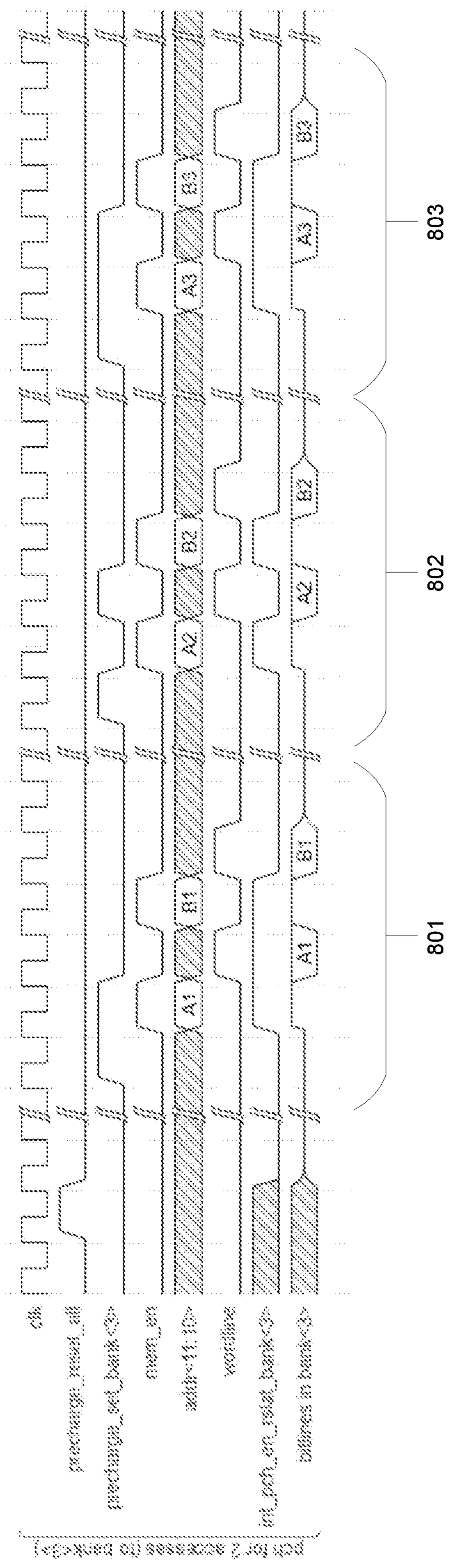
FIG. 8 illustrates yet another SRAM timing diagram.

FIG. 8 illustrates yet another SRAM timing diagram. This example illustrates pre-charging for two consecutive memory accesses. The 3 time periods 801, 802, and 803 illustrate how the inputs (clk, mem_en, addr<11:10>, and precharge_set_bank<x>) affect the outputs of the internal flip-flops (int_pch_en_rslat_bank<x>), which may be Reset/Set flip-flops, for example. In this particular example, each memory access takes two cycles. So while a memory access is happening, there are three ways to assert a "precharge_set_bank" input. At the clock rising edge with mem_en asserted, if the precharge_set_bank<x> is also asserted, then the corresponding int_pch_en_rslat_bank<x> stays asserted (801 and 803); otherwise, the corresponding int_pch_en_rslat_bank<x> will be deasserted (802; deasserted in between two clock cycles with mem_en asserted).

Advantageously, in this illustrative example, the timing of the pre-charge signal, here "precharge_set_bank<3>", controls the timing that the pre-charge voltage is applied to bit lines in the bank, which illustrates the flexibility of the techniques presented herein. During the time period labeled 801, clk rising edge occurs with addr A1 asserted and precharge_set_bank<3> stays asserted for two clock cycles. Therefore, the bit line voltage, int_pch_en_rslat_bank<3>, stays asserted until clk rising with addr B1 is asserted. Accordingly, the first clock cycle of precharge_set_bank<3> is associated with access A1, while the second clock cycle of precharge_set_bank<3> is associated with access B1. Time period 801 is an example of how the second clock cycle of precharge_set_bank<3>, associated with access B1, occurs simultaneously with the mem_en for in-progress access A1.

During the time period labeled 802, clk rising edge with addr A2 asserted, since precharge_set_bank<3> is not asserted, therefore, int_pch_en_rslat_bank<3> is de-asserted when word line (A2) is asserted. However, during clk rising edge with precharge_set_bank<3> asserted (in between addr A2 and B2), int_pch_en_rslat_bank<3> gets asserted, and the bit lines are pre-charged to get ready for B2 memory access. Accordingly, the first clock cycle of precharge_set_bank<3> is associated with access A2, while the second clock cycle of precharge_set_bank<3> is associated with access B2. Time period 802 is an example of how the second clock cycle of precharge_set_bank<3>, associated with access B2, occurs simultaneously with the SRAM bit cell access for in-progress access A2.

During the time period labeled 803, precharge_set_bank<3> input is asserted for 3 clock cycles. However, int_pch_en_rslat_bank<3> has the same behavior. Time period 803 illustrates a combination of 801 and 802. The first clock cycle of precharge_set_bank<3> is associated with access A3, while the second and third clock cycles of precharge_set_bank<3> are associated with access B3. Time period 803 further illustrates the pipelining of 801 and 802 (B3's precharge is asserted during A3's mem_en cycle and A3's sram bitcell access cycle), but also illustrates how the present techniques may keep the precharge input active for multiple cycles for a given request (B3 in this case), if needed.

FURTHER EXAMPLES

Each of the following non-limiting features in the following examples may stand on its own or may be combined in various permutations or combinations with one or more of the other features in the examples below. In various embodiments, the present disclosure may be implemented as a processor or method.

Embodiments of the present disclosure include a static random access memory (SRAM) circuit comprising: an SRAM memory bank configured to store bits of data, the SRAM memory bank comprising a plurality of bit lines; and an SRAM access control circuit coupled to the plurality of bit lines of the SRAM memory bank, the SRAM access control circuit configured to pre-charge the plurality of bit lines to access the stored bits of data, wherein the SRAM access control circuit receives and stores a pre-charge signal for a subsequent cycle when the SRAM access control circuit is accessing stored bits of data in the SRAM memory bank on a current cycle.

In another embodiment, the present disclosure includes a method of pre-charging an SRAM circuit comprising: storing bits of data in an SRAM memory bank, the SRAM memory bank comprising a plurality of bit lines; receiving and storing, by an SRAM access control circuit, a pre-charge signal for a subsequent cycle when the SRAM access control circuit is accessing stored bits of data in the SRAM memory bank on a current cycle; and pre-charging, by the SRAM access control circuit, the plurality of bit lines based on the pre-charge signal to access the stored bits of data of the SRAM memory bank.

In one embodiment, when the SRAM access control circuit is not accessing stored bits of data in the SRAM memory bank on the current cycle, the pre-charge signal causes the plurality of bit lines to pre-charge.

In one embodiment, when the SRAM access control circuit is accessing stored bits of data in the SRAM memory bank on the current cycle, the pre-charge signal is stored in the SRAM access control circuit to automatically pre-charge the plurality of bit lines when the current memory access is completed.

In one embodiment, when the pre-charge signal indicates there is no pre-charge for the subsequent cycle, then the SRAM access control circuit does not pre-charge the bit lines when the current memory access is completed.

In one embodiment, when the pre-charge signal indicates there is no pre-charge for the subsequent cycle, then the SRAM access control circuit further turns off one or more head switches providing power to a plurality of word lines when the current memory access is completed.

In one embodiment, the pre-charge signal comprises one or more bits.

In one embodiment, the SRAM memory bank comprises a plurality of memory sub-banks and the pre-charge signal comprises a corresponding number of bits to independently pre-charge the plurality of memory sub-banks.

In one embodiment, the number of bits is equal to a number of the plurality of memory sub-banks.

In one embodiment, the SRAM access control circuit comprises a plurality of pre-charge signal inputs equal to a number of the plurality of memory sub-banks.

In one embodiment, the SRAM access control circuit comprises a plurality of flip flops for storing the plurality of pre-charge signal inputs equal to the number of the plurality of memory sub-banks.

In one embodiment, the SRAM access control circuit comprises a pre-charge-reset input to clear the pre-charge on the plurality of bit lines.

In one embodiment, the pre-charge-reset input further clears pre-charge signals stored in the SRAM access control circuit.

In one embodiment, the pre-charge-reset input further turns off one or more head switches providing power to a plurality of word lines.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:

1. A static random access memory (SRAM) circuit comprising:

an SRAM memory bank configured to store bits of data, the SRAM memory bank comprising a plurality of bit lines; and an SRAM access control circuit coupled to the plurality of bit lines of the SRAM memory bank, the SRAM access control circuit configured to pre-charge the plurality of bit lines to access the stored bits of data, wherein the SRAM access control circuit receives, at a pre-charge request input, and stores a pre-charge signal for a subsequent cycle while the SRAM access control circuit is accessing stored bits of data in the SRAM memory bank on a current cycle, and wherein the SRAM access control circuit comprises a pre-charge-reset input to clear the pre-charge on the plurality of bit lines and to clear pre-charge signals stored in the SRAM access control circuit.

2. The SRAM circuit of claim 1, wherein when the SRAM access control circuit is not accessing stored bits of data in the SRAM memory bank on the current cycle, the pre-charge signal causes the plurality of bit lines to pre-charge.

3. The SRAM circuit of claim 1, wherein when the SRAM access control circuit is accessing stored bits of data in the SRAM memory bank on the current cycle, the pre-charge signal is stored in the SRAM access control circuit to automatically pre-charge the plurality of bit lines when the current memory access is completed.

4. The SRAM circuit of claim 1, wherein when the pre-charge signal indicates there is no pre-charge for the subsequent cycle, then the SRAM access control circuit does not pre-charge the bit lines when the current memory access is completed.

5. The SRAM circuit of claim 4, wherein when the pre-charge signal indicates there is no pre-charge for the subsequent cycle, then the SRAM access control circuit further turns off one or more head switches providing power to a plurality of word lines when the current memory access is completed.

6. The SRAM circuit of claim 1, wherein the pre-charge signal comprises one or more bits.

7. The SRAM circuit of claim 1, wherein the SRAM memory bank comprises a plurality of memory sub-banks and the pre-charge signal comprises a corresponding number of bits to independently pre-charge the plurality of memory sub-banks.

8. The SRAM circuit of claim 7, wherein the number of bits is equal to a number of the plurality of memory sub-banks.

9. The SRAM circuit of claim 7, wherein the SRAM access control circuit comprises a plurality of pre-charge signal inputs equal to a number of the plurality of memory sub-banks.

10. The SRAM circuit of claim 9, wherein the SRAM access control circuit comprises a plurality of flip flops for storing the plurality of pre-charge signal inputs equal to the number of the plurality of memory sub-banks.

11. The SRAM circuit of claim 9, wherein the pre-charge-reset input further clears pre-charge signals stored in the SRAM access control circuit.

12. The SRAM circuit of claim 11, wherein the pre-charge-reset input further turns off one or more head switches providing power to a plurality of word lines.

13. A method, comprising:

receiving, at a pre-charge request input, a pre-charge signal at an SRAM memory bank;

storing the pre-charge signal while an SRAM access control circuit is accessing stored bits of data in the SRAM memory bank on a current cycle; and pre-charging, by the SRAM access control circuit, a plurality of bit lines of the SRAM memory bank based on the pre-charge signal to access stored bits of data of the SRAM memory bank, wherein the SRAM access control circuit comprises a pre-charge-reset input to clear the pre-charge on the plurality of bit lines and to clear pre-charge signals stored in the SRAM access control circuit.

14. The method of claim 13, wherein when the SRAM access control circuit is not accessing stored bits of data in the SRAM memory bank on the current cycle, the pre-charge signal causes the plurality of bit lines to pre-charge.

15. The method of claim 13, wherein when the SRAM access control circuit is accessing stored bits of data in the SRAM memory bank on the current cycle, the pre-charge signal is stored in the SRAM access control circuit to automatically pre-charge the plurality of bit lines when the current memory access is completed.

16. The method of claim 13, wherein when the pre-charge signal indicates there is no pre-charge for the subsequent cycle, then the SRAM access control circuit does not pre-charge the bit lines when the current memory access is completed.

17. The method of claim 16, wherein when the pre-charge signal indicates there is no pre-charge for the subsequent cycle, then the SRAM access control circuit further turns off one or more head switches providing power to a plurality of word lines when the current memory access is completed.

18. The method of claim 13, wherein the pre-charge signal comprises one or more bits.

19. The method of claim 13, wherein the SRAM memory bank comprises a plurality of memory sub-banks and the pre-charge signal comprises a corresponding number of bits to independently pre-charge the plurality of memory sub-banks.

* * * * *